(12) United States Patent
Chen (10) Patent No.: US 11,765,851 B1
(45) Date of Patent: Sep. 19, 2023

(54) CABLE MANAGEMENT RACK FOR COMPUTER CABINETS

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 0 days.

(21) Appl. No.: 17/875,444

(22) Filed: Jul. 28, 2022

(51) Int. Cl.
H05K 7/14 (2006.01)

(52) U.S. Cl.
CPC .................................. H05K 7/1491 (2013.01)

(58) Field of Classification Search
CPC .................................................... H05K 7/1491
See application file for complete search history.

(56) References Cited

U.S. PATENT DOCUMENTS

| | | | |
|---|---|---|---|
| 6,600,665 B2 | 7/2003 | Lauchner | |
| 8,186,634 B2 | 5/2012 | Chen et al. | |
| 9,144,174 B2 | 9/2015 | Chen et al. | |
| 9,383,038 B2* | 7/2016 | Chen | F16L 3/015 |
| 10,356,932 B2* | 7/2019 | Chen | H05K 7/1491 |
| 10,638,636 B1* | 4/2020 | Chen | H05K 7/1489 |
| 11,134,582 B2* | 9/2021 | Chen | H05K 7/1491 |
| 11,177,649 B2* | 11/2021 | Hazani | H04W 52/0206 |
| 11,276,995 B2* | 3/2022 | Chen | H02G 3/0406 |

* cited by examiner

*Primary Examiner* — Anthony Q Edwards
*Assistant Examiner* — Hung Q Dang
(74) *Attorney, Agent, or Firm* — Fei-Hung Yang (57) ABSTRACT

A cable management rack for computer cabinets includes: a main body stretchable and retractable by folding and having cables accommodating boxes for storing cables; a locking mechanism having a first assembly part, a safety locking tab, a second assembly part and an elastic locking plate installed at ends of the inner rail and the outer rail on the same side; two home positioning plates, a support frame and an outer rail fastener. The safety locking tab and the elastic locking plate prevent the inner rail from falling off when pulling out the outer rail. The support frame is installed under the main body, and a positioning block is arranged relative to the main body to prevent the main body from sagging or falling off. The outer rail fastener covers the outer part of the outer rail and the sliding rail bracket to improve structural strength and stability.

6 Claims, 7 Drawing Sheets

CABLE MANAGEMENT RACK FOR COMPUTER CABINETS

BACKGROUND

Technical Field

The present disclosure relates to the field of a slide rail structure, and more particularly relates to a cable management rack for computer cabinets having the advantages of preventing a main body from falling off during installation, providing quick installation and removal by a locking means, adopting the design of a home positioning plate and a support frame to prevent the main body from sagging and falling back after storage, and using an outer rail fastener to increase the structural strength and avoid deformation occurred during pulling out a computer for use, so as to improve the stability of use.

Description of Related Art

In general, a computer cabinet used in common industrial servers has a plurality of accommodation spaces corresponding to the interior of the industrial server, so that the plurality of industrial servers are arranged in the computer cabinet in a vertical stacking manner, and each industrial server has various connection cables for transmitting signals and power. Since both sides of the industrial servers are equipped with slide rail assemblies, the industrial servers can be pulled out from the computer cabinet like a drawer, or pushed in from the outside and stored. Therefore, the connection cables will be disordered or tangled, resulting in an embarrassing situation during follow-up maintenance, and there is a cable management rack structure capable of arranging the connection cables corresponding to each industrial server introduced to avoid the above embarrassing situation. The design of the relevant cable management structure has been disclosed in U.S. Pat. Nos. 6,600,665 B2, 8,186,634 B2 and 9,144,174 B2, etc. which are incorporated herein for reference.

However, most structural designs of a common cable management rack adopt a plurality of frames pivotally coupled to each other in a head-to-tail manner, so that the frame can be folded and unfolded relative to each other. When a servo computer host is pulled out, the frames can be transformed from a bent and folded state to an unfolded and elongated state to ensure that the connection cables are still kept in the cable management rack structure during their moving process, without becoming disordered and tangled. However, when this type of cable management rack structure is installed on the slide rail, positioning components such as pivots are used for installation and fixation. Therefore, when it is necessary to add a new connection cable or maintain the equipment, these positioning elements must be loosened first to remove the cable management frame, and after installation, the cable management frame must be tightened and fixed again, which is quite time-consuming and labor-intensive, and the locking effect is not good, and there is a risk of loosening. Moreover, since these industrial servers have different sizes, the larger the industrial server, in addition to the larger capacity, the more connection cables required, and the larger the weight. Most of these cable management rack structures come with a two-stage or three-stage design. Since the length of the three-stage cable management rack structure is usually limited, and a too-long design will cause the problem of insufficient supporting force and sag. In severe cases, the bottom of the servo computer host chassis may be worn, so that a connecting frame connected between the two slide rails is used as the relay, and a cable management rack is respectively set on the two sides of the connecting frame. When the servo computer host is pulled, the connecting frame will slide out synchronously. Further, a structure for supporting the cable management rack is provided to prevent the cable management rack from sagging and falling, which may squeeze or damage the connection cable. In fact, the design of this connection frame may be able to prevent sagging when it is used telescopically, but when the cable management rack is retracted to the rear for storage, there is a certain possibility that the cable management rack goes beyond the range that the connection frame can support. The above-mentioned situations are the problems that often occur when the existing cable management rack structure is used. Obviously, it is necessary to improve the stability, convenience and safety of the installation and overcome the abovementioned drawbacks.

SUMMARY

In view of the aforementioned drawbacks of the related art, it is a primary objective of the present disclosure is to provide a cable management rack for computer cabinets, having the advantages of preventing a main body from falling off during installation, providing quick installation and removal by a locking means, adopting the design of a home positioning plate and a support frame to prevent the main body from sagging and falling back after storage, and using an outer rail fastener to increase the structural strength and avoid deformation occurred during pulling out a computer for use, so as to improve the stability, convenience, and safety of use.

To achieve the aforementioned and other objectives, this disclosure discloses a cable management rack for computer cabinets, installed at ends of a pair of slide rails, wherein each slide rail comprises an inner rail, a middle rail, an outer rail, a plurality of slip elements and a slide rail bracket, and the slide rail is installed in the computer cabinet through the slide rail bracket, and the cable management rack comprises: a main body, formed by movably pivoting a plurality of frames with one another in a head-to-tail manner, and the frames having a plurality of cable accommodating boxes disposed thereon for storing a plurality of cables therein; a locking mechanism, comprising a first assembly part, a safety locking tab, a second assembly part and an elastic locking plate, and the first assembly part and the second assembly part being movably pivoted to two ends of the main body respectively, and the safety locking tab being installed to a side of the first assembly part, and the elastic locking plate being installed to a side of the second assembly part, and an end of the inner rail being provided with two first positioning columns spaced apart from each other, and the first assembly part having two first positioning holes configured to be corresponsive to the two first positioning columns respectively, such that when the first assembly part is installed to the inner rail, the two first positioning columns are disposed in the two first positioning holes, and the safety locking tab being used to latch one of the first positioning columns to define a locking status, and the outer rail having a guide slot and a second positioning column, and the second assembly part having a second positioning hole, such that after the front end of the second assembly part is inserted into the guide slot, the second positioning column is disposed in the second positioning hole, and the second positioning column is latched by the elastic locking plate to define the locking status; a pair of home positioning plates, each being a substantially L-shaped structure, and having a first fixing part disposed at an end thereof, configured to be corresponsive to the outer rail, and provided for being installed to ends on two sides of the outer rail, and a second fixing part disposed at the other end of each home positioning plate; a support frame, with two ends having a third fixing part installed onto the second fixing part of the pair of home positioning plates, and the support frame having a positioning stop block configured to be opposite to the main body; and an outer rail fastener, having a plurality of claw hooks configured to be corresponsive to the outer rail and the slide rail bracket respectively, and provided for covering the outer rail and the slide rail bracket and integrated as a whole.

In an embodiment, the safety locking tab has an end fixed onto a plane of the first assembly part, and the other end bent, spaced and protruded from the plane of the first assembly part to form a first pressing part, and a first inner frame is formed in the safety locking tab, and the front edge of the first inner frame and the first positioning hole define a first lock space provided for locking the first positioning column that enters into the first lock space, and the first pressing part can be pressed to release the first lock space, such that the two first positioning columns move in opposite directions and out of the range of the limit of the two first positioning holes. In addition, the elastic locking plate has an end fixed onto a plane of the second assembly part, and the other end of the elastic locking plate has a second pressing part formed by bending the elastic locking plate and spaced and protruded from the plane of the second assembly part, and the elastic locking plate has a second inner frame formed therein, and the front edge of the second inner frame and the second positioning hole define a second lock space, and capable of locking the second positioning column entering into the second lock space therein, and releasing the second positioning column from the second lock space after the second pressing part is pressed, so that the second positioning column moves in an opposite direction and out of the limit range of the second positioning hole.

In another embodiment, the second fixing part is a long slotted hole, and the third fixing part is a fixing column, and when the third fixing part is installed to the second fixing part, the third fixing part can slide horizontally in the limit direction in the second fixing part. In addition, each cable accommodating box is formed by a substantially U-shaped box and a cover, and the cover is movably pivoted to a side of the box, and can be snapped to the other side of the box after turning over to define a closed status, and the backside of the box has a snap-in part configured to be corresponsive to the frame for snapping and fixing the cable accommodating box to a surface of the frame. In addition, the outer rail fastener has an elastic member disposed at the middle thereof, and the elastic member has a return bump, and a snap slot and a stop block formed on the surface of the outer rail and configured to be corresponsive to the return bump, and during assembling, the return bump falls into the snap slot, and the outer rail fastener is limited by the stop block to define a locking status.

DESCRIPTION OF THE EMBODIMENTS

This disclosure will now be described in more detail with reference to the accompanying drawings that show various embodiments of this disclosure.

Figure 1:
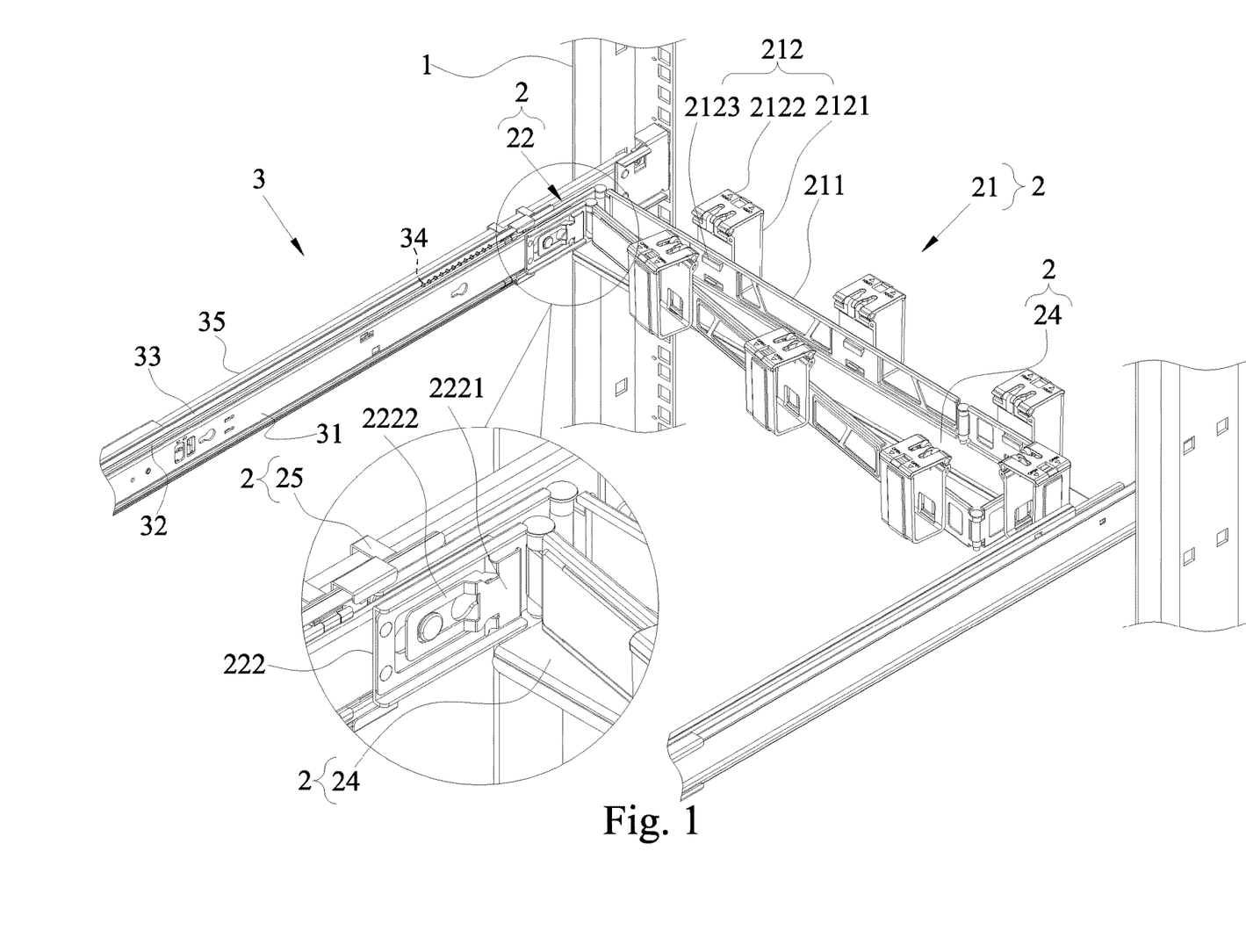
FIG. 1 is a first schematic view of the structure of a preferred embodiment of this disclosure.
Figure 2:
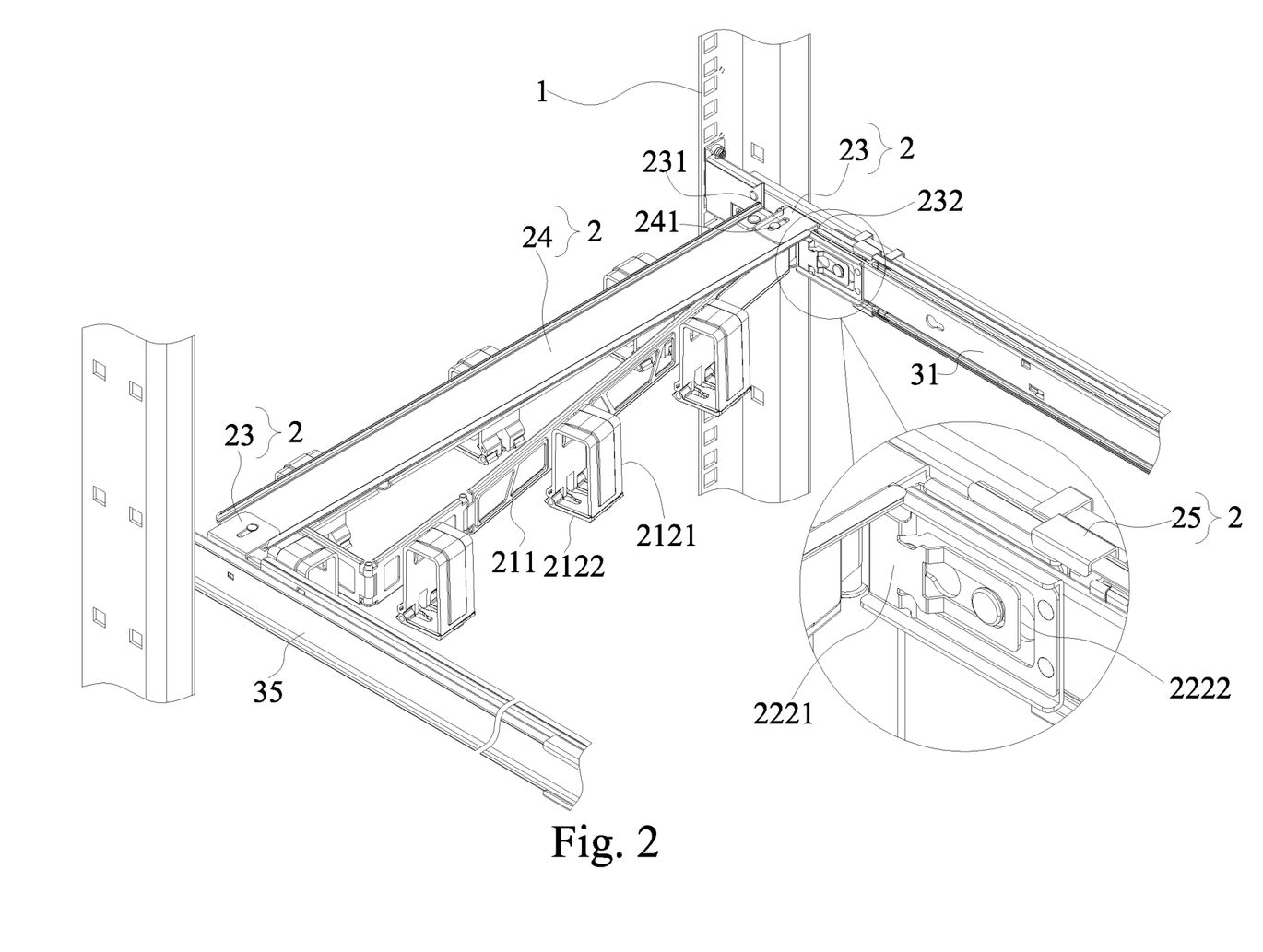
FIG. 2 is a second schematic view of the structure of a preferred embodiment of this disclosure.
Figure 3:
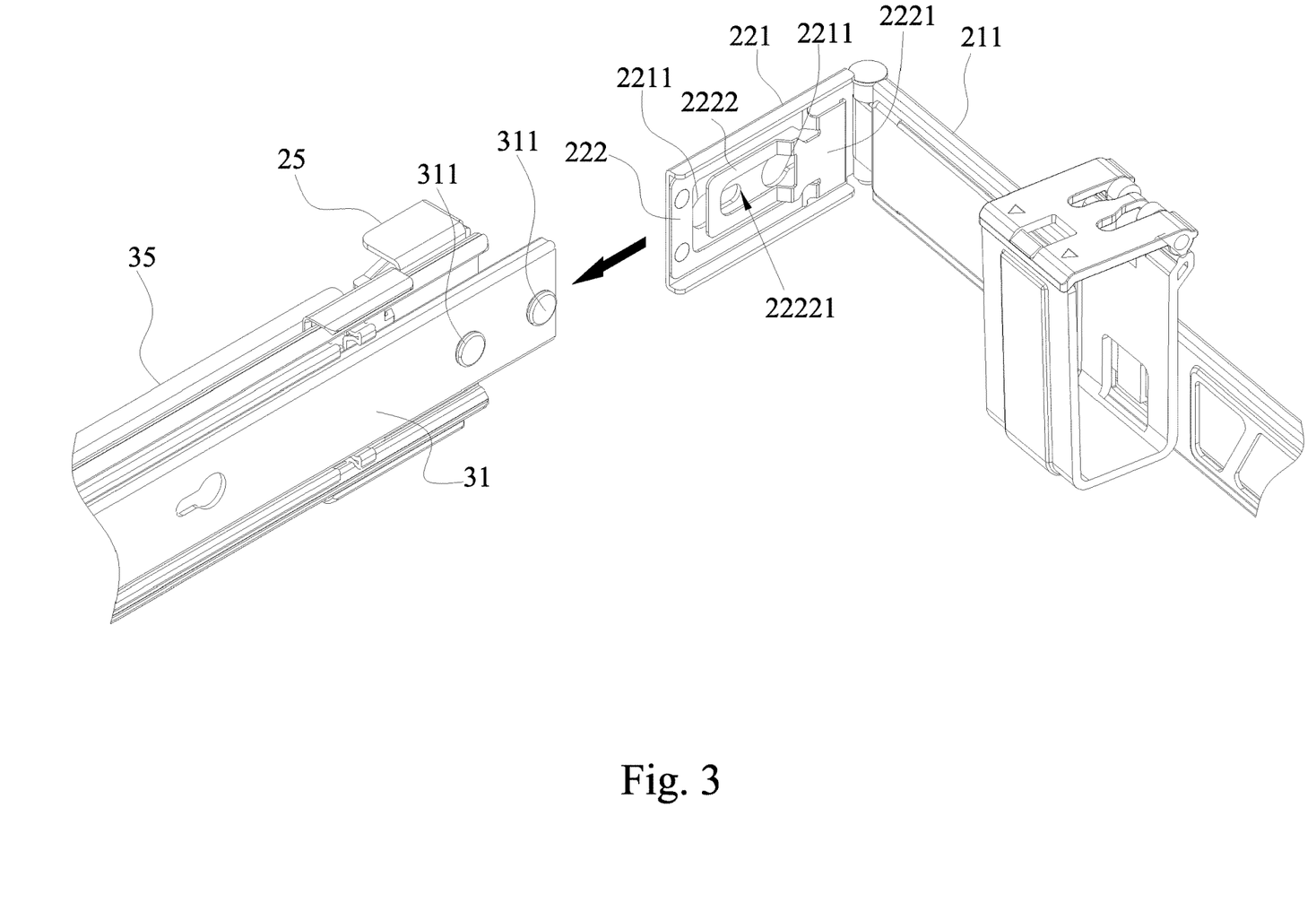
FIG. 3 is a first schematic view of the structure of a preferred embodiment of this disclosure in the status of installation.
Figure 4:
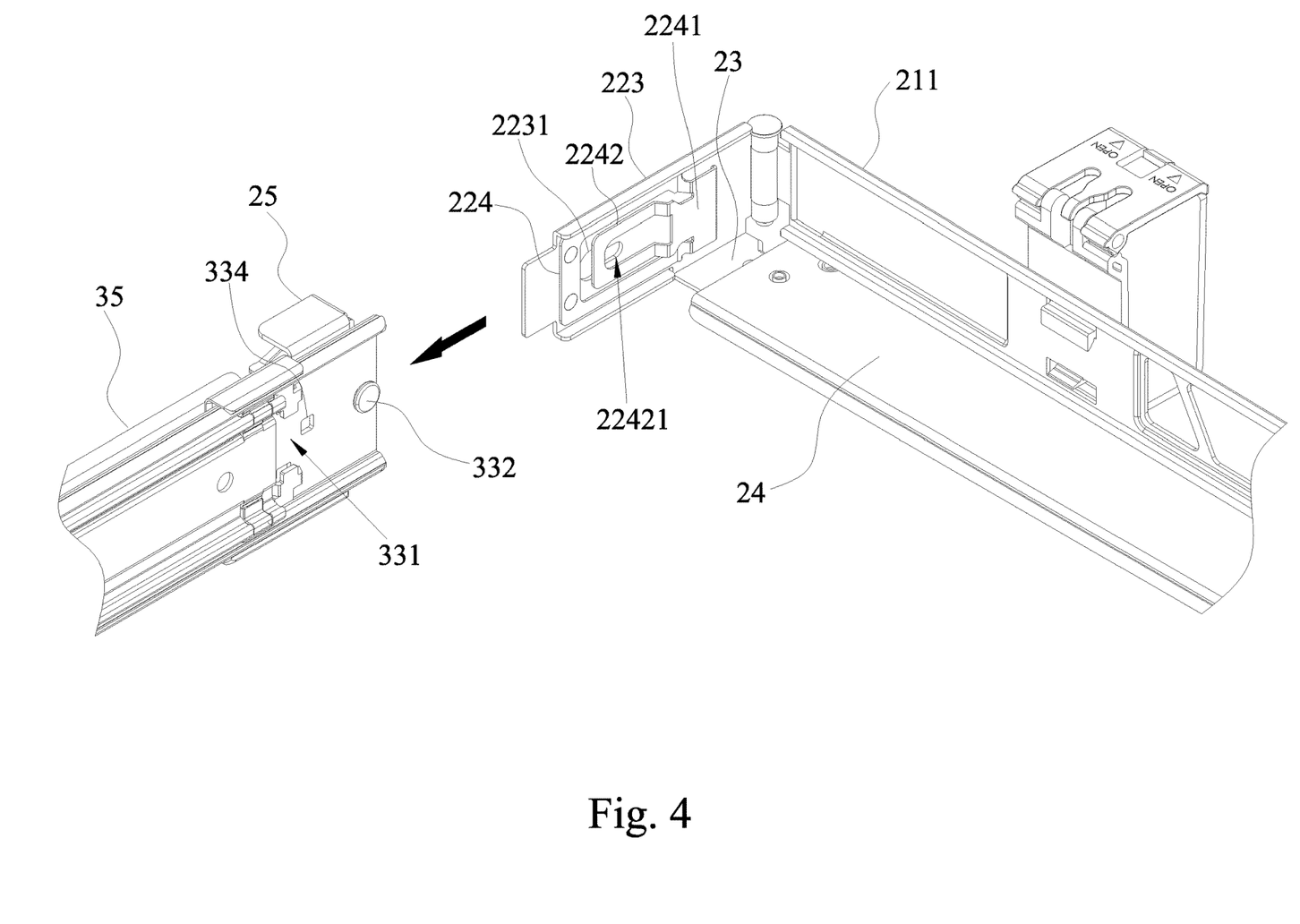
FIG. 4 is a second schematic view of the structure of a preferred embodiment of this disclosure in the status of installation.
Figure 5:
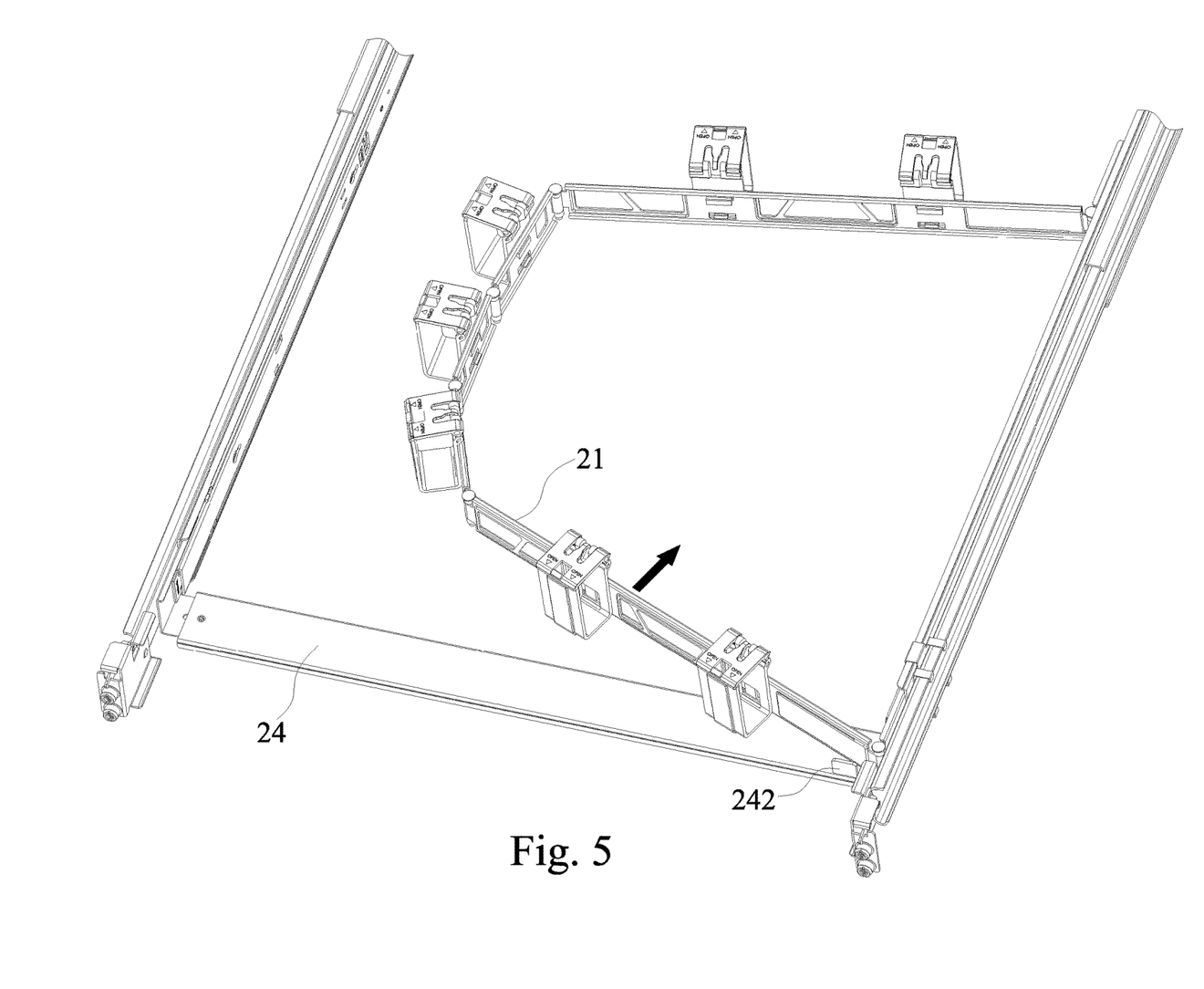
FIG. 5 is a schematic view of the structure of a preferred embodiment of this disclosure in the status of pulling out for use.
Figure 6:
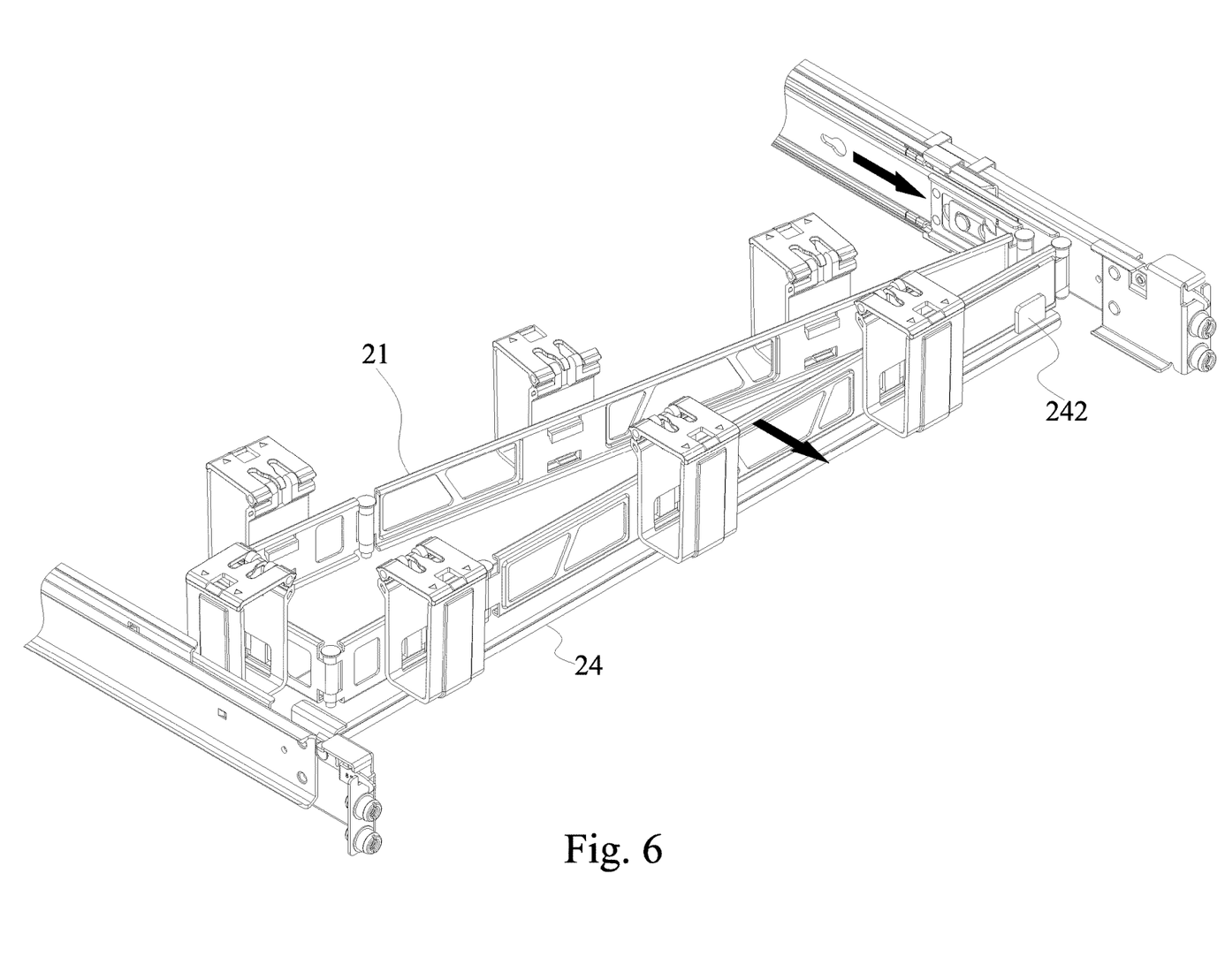
FIG. 6 is a schematic view of the structure of a preferred embodiment of this disclosure in the status of retracting for storage.
Figure 7:
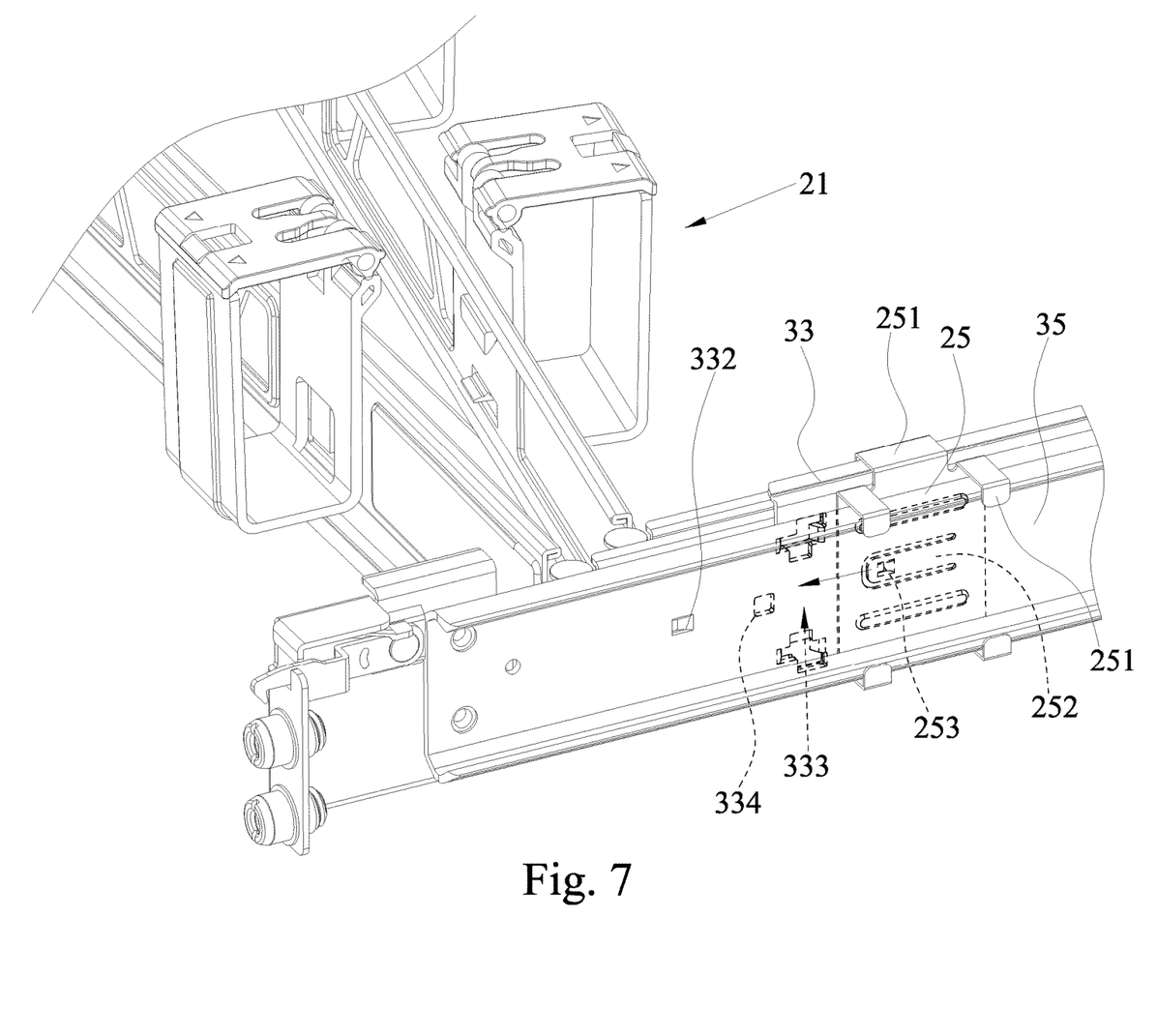
FIG. 7 is a schematic view of the structure of a preferred embodiment of this disclosure during reinforcement.

With reference to FIGS. 1 to 7 for different schematic structural views, schematic installation views and schematic application views of a cable management rack for computer cabinets in accordance with a preferred embodiment of this disclosure respectively, the cable management rack 2 of the computer cabinet 1 of this disclosure is provided to be installed at ends of a pair of slide rails 3, wherein each slide rail 3 includes an inner rail 31, a middle rail 32, an outer rail 33, a plurality of slip elements 34 and a slide rail bracket 35. The slide rail 3 is installed in the computer cabinet 1 through the slide rail bracket 35, and the cable management rack 2 includes a main body 21, a locking mechanism 22, a pair of home positioning plates 23, a support frame 24 and an outer rail fastener 25.

The main body 21 is formed by movably pivoting a plurality of frames 211 with one another in a head-to-tail manner, and the frames 211 have a plurality of cable accommodating boxes 212 for storing a plurality of cables 4 inside. It is noteworthy that each cable accommodating box 212 is formed by a substantially U-shaped box 2121 and a cover 2122, and the cover 2122 is movably pivoted to a side of the box 2121, and can be snapped to the other side of the box 2121 after turning over to define a closed status, and the backside of the box 2121 has a snap-in part 2123 configured to be corresponsive to the frame 211 for snapping and fixing the cable accommodating box 212 to a surface of the frame 211.

The locking mechanism 22 includes a first assembly part 221, a safety locking tab 222, a second assembly part 223 and an elastic locking plate 224, and the first assembly part 221 and the second assembly part 223 are respectively and movably pivoted to two ends of the main body 21, and the safety locking tab 222 is disposed on a side of the first assembly part 221, and the elastic locking plate 224 is installed on a side of the second assembly part 223, and an end of the inner rail 31 is provided with two first positioning columns 311 which are spaced apart from each other, and the first assembly part 221 has two first positioning holes 2211 configured to be corresponsive to the two first positioning columns 311, such that when the first assembly part 221 is installed to the inner rail, the two first positioning columns 311 are disposed in the two first positioning holes 2211, and the safety locking tab 222 is used to latch one of the first positioning columns to define a locking status, and the outer rail 33 has a guide slot 331 and a second positioning column 332, and the second assembly part 223 has a second positioning hole 2231, such that after the front end of the second assembly part 223 into the guide slot 331, the second positioning column 332 is disposed in the second positioning hole 2231, and the elastic locking plate 224 is latched by the second positioning column 332 to define the locking status; wherein the safety locking tab 222 has an end fixed onto a plane of the first assembly part 221, and the other end bent, spaced and protruded from the plane of the first assembly part 221 to form a first pressing part 2221, and a first inner frame 2222 is formed in the safety locking tab 222, and the front edge of the first inner frame 2222 and a first positioning hole 2211 define a first lock space 22221 provided for locking the first positioning column 311 that enters into the first lock space 22221 in the first lock space, and the first pressing part 2221 can be pressed to release the first lock space 22221, such that the two first positioning columns 311 move in opposite directions and out of the range of the limit of the two first positioning holes 2211. In addition, the elastic locking plate 224 has an end fixed to a plane of the second assembly part 223 and the other end bent, spaced and protruded from the plane of the second assembly part 223 to form a second pressing part 2241, and a second inner frame 2242 is formed in the elastic locking plate 224, and the front edge of the second inner frame 2242 and the second positioning hole 2231 define a second lock space 22421 for locking the second positioning column 332 that enters into the second lock space 22421 in the second lock space 22421, and releasing the second pressing part 2242 from the second lock space 22431 after the second pressing part 2242 is pressed, so that the second positioning column 332 moves in an opposite direction and out of the limit range of the second positioning hole 2231. The operation is easy and stable, and the components will not fall off easily after installation.

Each home positioning plate 23 is a substantially L-shaped structure, having a first fixing part 231 disposed at one end and corresponding to the outer rail 33 and provided for being installed at ends on the two sides of the outer rail 33, and the other end of each home positioning plate 23 has a second fixing part 232.

Both ends of the support frame 24 have a third fixing part 241 provided for being installed onto the second fixing parts 231 of the pair of home positioning plates 12 respectively, and the support frame 24 has a positioning stop block 242 disposed opposite to the main body 21; wherein, the second fixing part 232 is a long slotted hole, and the third fixing part 241 is a fixing column, and when the third fixing part 241 is installed to the second fixing part 232, the third fixing part 241 can slide horizontally in the limit direction of the second fixing part 232.

The outer rail fastener 25 has a plurality of claw hooks 251 configured to be corresponsive to the outer rail 33 and the slide rail bracket 35 respectively and covered onto the outer rail 33 and the slide rail bracket 35 to integrate them as a whole. Wherein, the outer rail fastener 25 has an elastic member 252 disposed at the middle of the outer rail fastener 25, and the elastic member 252 has a return bump 253, and a snap slot 333 and a stop block 334 are disposed on a surface of the outer rail 33 and configured to be corresponsive to the return bump 253, and during assembling, the return bump 253 falls into the snap slot 333, and the outer rail fastener 25 is limited by the stop block 334 to define a locking status.

Therefore, when the cable management rack for computer cabinets in accordance with this disclosure is installed and used, the main body 21 can be installed quickly through the locking mechanisms 22 at the two ends respectively and prevent the main body 21 from falling out when pulling out process and provide a fast and convenient installation and removal. In addition, the pair of home positioning plates 23 and the support frame 24 can prevent the main body 21 from sagging during use and from falling backward after storage and the outer rail fastener 25 is added and combined with the outer rail 33 and the slide rail bracket 35 to improve the structural strength and avoid deformation during pulling out and use. Obviously, this disclosure can achieve the effect improving the stability, convenience and safety of use.

What is claimed is:

1. A cable management rack for a computer cabinet, installed at ends of a pair of slide rails, wherein each slide rail comprises an inner rail, a middle rail, an outer rail, a plurality of slip elements and a slide rail bracket, and the slide rail is installed in the computer cabinet through the slide rail bracket, the cable management rack comprising:

a main body, formed by movably pivoting a plurality of frames with one another in a head-to-tail manner, and the frames having a plurality of cable accommodating boxes disposed thereon for storing a plurality of cables therein;

a locking mechanism, comprising a first assembly part, a safety locking tab, a second assembly part and an elastic locking plate, and the first assembly part and the second assembly part being movably pivoted to two ends of the main body respectively, and the safety locking tab being installed to a side of the first assembly part, and the elastic locking plate being installed to a side of the second assembly part, and an end of the inner rail being provided with two first positioning columns spaced apart from each other, and the first assembly part having two first positioning holes configured to be corresponsive to the two first positioning columns respectively, such that when the first assembly part is installed to the inner rail, the two first positioning columns are disposed in the two first positioning holes, and the safety locking tab being used to latch one of the first positioning columns to define a locking status, and the outer rail having a guide slot and a second positioning column, and the second assembly part having a second positioning hole, such that after-front end of the second assembly part is inserted into the guide slot, the second positioning column is disposed in the second positioning hole, and the second positioning column is latched by the elastic locking plate to define a locking status;

a pair of home positioning plates, each being a substantially L-shaped structure, and having a first fixing part disposed at an end thereof, configured to be corresponsive to the outer rail, and provided for being installed to ends on two sides of the outer rail, and a second fixing part disposed at the other end of each home positioning plate;

a support frame, with two ends having a third fixing part installed onto the second fixing part of the pair of home positioning plates, and the support frame having a positioning stop block configured to be opposite to the main body; and an outer rail fastener, having a plurality of claw hooks configured to be corresponsive to the outer rail and the slide rail bracket respectively, and provided for covering the outer rail and the slide rail bracket and integrated as a whole.

2. The cable management rack for computer cabinets according to claim 1, wherein the safety locking tab has an end fixed onto a plane of the first assembly part, and the other end bent, spaced and protruded from the plane of the first assembly part to form a first pressing part, and a first inner frame is formed in the safety locking tab, and front edge of the first inner frame and the first positioning hole define a first lock space provided for locking the first positioning column that enters into the first lock space, and the first pressing part can be pressed to release the first lock space, such that the two first positioning columns move toward an opposite direction and out of the range of the limit of the two first positioning holes.

3. The cable management rack for computer cabinets according to claim 1, wherein the elastic locking plate has an end fixed onto a plane of the second assembly part, and the other end of the elastic locking plate has a second pressing part formed by bending the elastic locking plate and spaced and protruded from the plane of the second assembly part, and the elastic locking plate has a second inner frame formed therein, and front edge of the second inner frame and the second positioning hole define a second lock space, and capable of locking the second positioning column entering into the second lock space therein, and releasing the second positioning column from the second lock space after the second pressing part is pressed, so that the second positioning column moves in an opposite direction and out of the limit range of the second positioning hole.

4. The cable management rack for computer cabinets according to claim 1, wherein the second fixing part is a long slotted hole, and the third fixing part is a fixing column, and when the third fixing part is installed to the second fixing part, the third fixing part can slide horizontally in a limit direction in the second fixing part.

5. The cable management rack for computer cabinets according to claim 1, wherein each cable accommodating box is formed by a box, which is substantially U-shaped, and a cover, and the cover is movably pivoted to a side of the box, and can be snapped to the other side of the box after turning over to define a closed status, and a backside of the box has a snap-in part configured to be corresponsive to the frame for snapping and fixing the cable accommodating box to a surface of the frame.

6. The cable management rack for computer cabinets according to claim 1, wherein the outer rail fastener has an elastic member disposed at the middle thereof, and the elastic member has a return bump, and a snap slot and a stop block formed on surface of the outer rail and configured to be corresponsive to the return bump, and during assembling, the return bump falls into the snap slot, and the outer rail fastener is limited by the stop block to define a locking status.

* * * * *